United States Patent

Iwasa et al.

[11] 3,991,329
[45] Nov. 9, 1976

[54] TOUCH-OPERATION SWITCH

[75] Inventors: Hitoo Iwasa, Takatsuki; Gota Kano, Nagaoka-kyo, both of Japan

[73] Assignee: Matsushita Electric Industrial Co., Ltd., Kadoma, Japan

[22] Filed: Jan. 31, 1975

[21] Appl. No.: 546,138

[30] Foreign Application Priority Data

Feb. 4, 1974    Japan .................................. 49-14808

[52] U.S. Cl. ................................ 307/308; 307/116; 307/304; 317/DIG. 2; 340/258 D
[51] Int. Cl.[2] ............... H01H 35/00; G01D 21/04; G08B 13/22; H03K 3/353
[58] Field of Search .................... 307/116, 308, 304; 328/1, 5; 317/DIG. 2; 340/258 R, 258 C, 258 D, 365 C

[56] References Cited
UNITED STATES PATENTS

| | | | |
|---|---|---|---|
| 3,452,346 | 6/1969 | Kupersmit | 340/258 D X |
| 3,603,811 | 9/1971 | Day et al. | 307/251 X |
| 3,628,283 | 12/1971 | Mizoule | 307/308 X |
| 3,798,462 | 3/1974 | Rizzo | 340/365 C X |
| 3,805,096 | 4/1974 | Hamilton | 307/308 |
| 3,879,618 | 4/1975 | Larson | 307/116 |

*Primary Examiner*—John S. Heyman
*Assistant Examiner*—Larry N. Anagnos
*Attorney, Agent, or Firm*—Cushman, Darby & Cushman

[57]      ABSTRACT

A touch-operation semiconductor switch is constituted by employing a switching device and a semiconductor negative resistance device comprising a complementary connection of a depletion mode n-channel junction type field-effect transistor (hereinafter: FET) and a depletion mode p-channel junction type FET, both FETs being connected by source to source to each other, and by each gate to each drain of the other FET, and a touching terminal is connected to said common connected sources, so that the on-off state of the negative resistance device is inversed when the touching terminal is touched by human body.

20 Claims, 4 Drawing Figures

Current I through the negative resistance device

Voltage V across the negative resistance device

3,991,329

TOUCH-OPERATION SWITCH

BACKGROUND OF THE INVENTION

This invention relates to a touch-operation switch, which switches by only a slight touching to a touching elecrode by a human body.

Hitherto, various kinds of touch-operation switches have been proposed and used. Such touch-operation switches are practically and widely used in electric appliances or electric machines, for instance, in electric fans or electric centrifugal dehydrators, in order to stop their operation for securing safety against inadvertent touches by a human body.

Conventionally, such touch-operation switches have been constituted in a manner that the switch detects the proximity or a touch of a human body by means of capacity change due to electrostatic induction, or that the switch detects a change of a weak electromagnetic field due to human proximity or a touch. Such conventional touch-operation switches pick up input signals of very small level, and therefore are liable to false operations due to noise. In order to eliminate such false operation, conventional touch-operation switch necessitates a complicated noise-resistant detection circuit.

SUMMARY OF THE INVENTION

Accordingly, the present invention provides a novel and simple but reliable touch-operation switch of fully semiconductorized type.

DETAILED DISCLOSURE OF THE INVENTION

Figure 2:
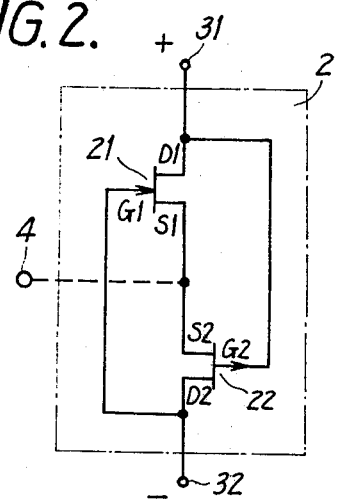
FIG. 2 is a circuit diagram showing electrical connection of a negative resistance device 2 employed in the circuit of FIG. 1.

Prior to describing the apparatus of the present invention, a negative-resistance device 2 for use in the apparatus of the present invention is elucidated referring to FIG. 2.

FIG. 2 shows a circuit example as disclosed in prior art, for example IEEE transactions on Circuit Theory, March 1963, page 25–35 and Proceedings of the IEEE, April 1965, page 404.

The negative resistance device 2 comprises complementary connection of an n-channel junction type field-effect transistor 21 and a p-channel junction type field-effect transistor 22, connected to each other as shown by source S1 to source S2, or their output circuits may be alternatively serially connected from drain to drain, or source to drain, in any case, and each gate is connected to the remaining drain or source of the opposite field-effect transistor.

In the specific example in FIG. 2, the gate electrode G1 of a depletion mode n-channel junction type FET 21 is connected to the drain electrode D2 of a depletion mode p-channel junction type FET 22, and the gate electrode G2 of the p-channel type FET 22 is connected to the drain electrode D1 of the n-channel type FET 21. Both source electrodes S1 and S2 of both FETs 21 and 22 are further series-connected to each other.

Figure 3:
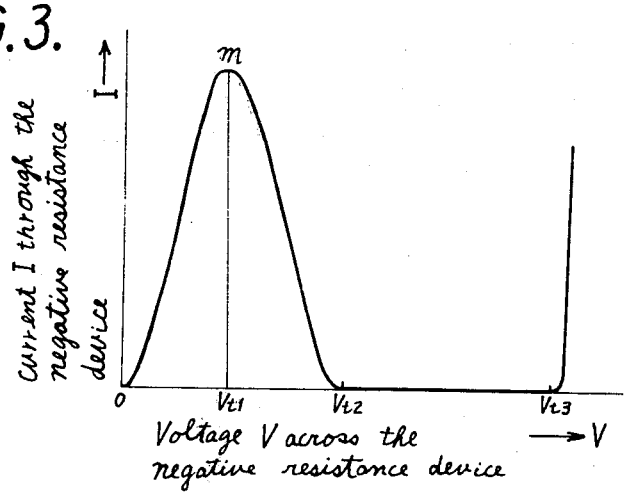
FIG. 3 is a graph showing relation between the voltage across the two terminals and the current from one terminal to the other terminal of the negative resistance device used in the touch-operation switch of the present invention.

When a voltage V is applied across two outer terminals 31 and 32, i.e., across one drain electrode D1 and the other drain electrode D2 of the series-connected pair of FETs F1 and F2 (with positive potential on the side of electrode D1), a known Λ (lambda, a Greek character)-type current-voltage characteristic as shown in FIG. 3 is obtained between voltage V and source current I. As is seen in FIG. 3, for a time from the starting voltage 0, the current I increases showing positive resistance characteristic as the voltage increases, but the current also shows gradually a saturation characteristic, and after the current exceeds the voltage of the peak current point $m$ (i.e., the first threshold voltage $V_t1$), namely, in the region between $V_t1$ and $V_t2$, the current declines as the voltage increases, showing a so-called negative-resistance characteristic. Finally, when the voltage exceeds the second threshold voltage $V_t2$, the current I enters the cut-off state. This cut-off state of the current continues until the voltage reaches a break-over voltage $V_t3$ where one of the FETs begins to break-down. When the voltage passes over the $V_t3$ point, a break-down current is produced. In the circuit constitution of FIG. 2, there are the first stable region of $0 < V \le V_t1$, and the second stable "OFF" region of $V_t2 \le V < V_t3$, and the unstable state lies in the applied voltage range of $V_t1 < V < V_t2$.

Structure

Figure 1:
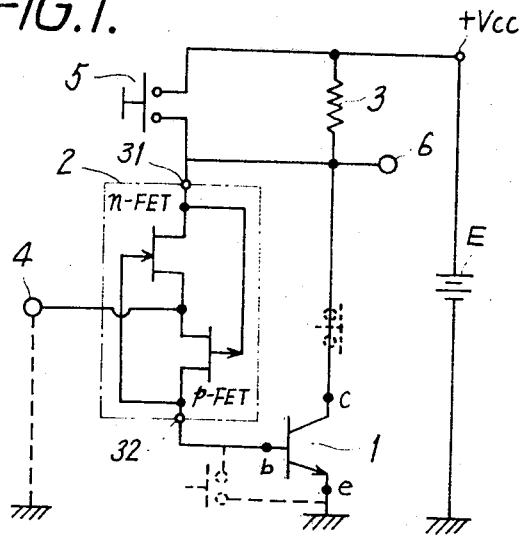
FIG. 1 is a circuit diagram of one example embodying the present invention.

FIG. 1 is a circuit diagram of one example of a touch-operation switch of the present invention. In FIG. 1, across a D.C. power source E an impedance, for instance, a resistor 3 and collector-emitter circuit of a bi-polar transistor 1 is connected in series, and a push-button resetting switch 5 which closes during a pressing is connected across the resistor 3, a semiconductor negative resistance device 2 of abovementioned type is connected across the base and collector of the transistor 1, a touching electrode 4 is connected to the common connected sources S1 and S2, and an output terminal 6 is connected to the collector 1 of the transistor 1.

Operation of the apparatus of FIG. 1 is as follows:

By application of the D.C. voltage of the power source E to the terminal +Vcc, a D.C. current is fed through the resistor 3 to the negative resistance device 2 and also to the collector-emitter circuit of the transistor 1. By appropriately selecting the resistance of the resistor 3, the voltage across the terminals 31 and 32 of the negative resistance device 2 is selected to be in the range between 0 and $V_t1$ (i.e., positive resistance range) of FIG. 3, with the touching electrode 4 free from a contact by human body, and accordingly the negative resistance device 2 is conductive. Since the negative resistance device 2 is conductive, the transistor 1 is made conductive, making the potential of the output terminal 6 "low".

Preliminary Resetting

Then, by pressing down and thereby temporarily closing the resetting switch 5, the potential at the output terminal 6 is raised to the source voltage in a moment, and therefore, the voltage across both terminals 31 and 32 of the negative resistance 2 is increased in a moment, to reach a voltage in the cut-off range of between $V_{t2}$ and $V_{t3}$, thereby making the negative resistance device 2 cut-off. Since the negative resistance device 2 is cut off, the transistor 1 turns off, retaining the potential of the output terminal 6 "high". This is defined as a first state, namely a reset state when the touching electrode 4 is not touched.

Turning the switch

When the touching electrode 4 is touched by a human body, the negative resistance 2 turns "on" thereby turning the transistor 1 "on". This is defined as a second state or a switched state.

The abovementioned "turning on" of the negative resistance device is made because of the following reason: When the touching electrode 4 is touched by a human body, under the condition that both FETs 21 and 22 of the negative resistance device 2 are cut off, i.e., of high impedance, the source-drain impedance of the second FET 22 is considered to be shortcircuited by an impedance, for instance, combination of resistance and capacitance, of the human body, which impedance is far smaller than the resistance between the drain and the source of FET 22. Due to the shortcircuiting between the source S2 and the drain D2 of the second FET 22, the voltage between the gate G1 connected to the drain D2 and the source S1 of the first FET 21 becomes zero, and therefore, because of the nature of a depletion mode FET, the first FET 21 turns "on". Due to this turning "on" of the first FET 21, the voltage drop between the drain D1 and the source S1 of the first FET 21 is negligible. Accordingly, the voltage between the gate G2 and the source S2 of the second FET 22 becomes nearly zero, too.

Therefore, because of the nature of a depletion mode FET, the second FET 22 turns "on". Due to the turns on of both FETs 21 and 22, as described in the above, the transistor 1 also turns on. By the abovementioned turning "on" of the transistor, the potential at the output terminal 6 becomes "low", thereby decreasing the voltage across both terminals 31–32 to the positive resistance range between the voltages 0 and $V_{t1}$, thereby holding the potential of the output terminal 6 "low".

Resetting the switch

Resetting of the switch from the abovementioned second state is made by temporarily closing the reset switch 5. By the closing, the circuit operates in the same way as described in the foregoing concerning the preliminary resetting.

Figure 4:
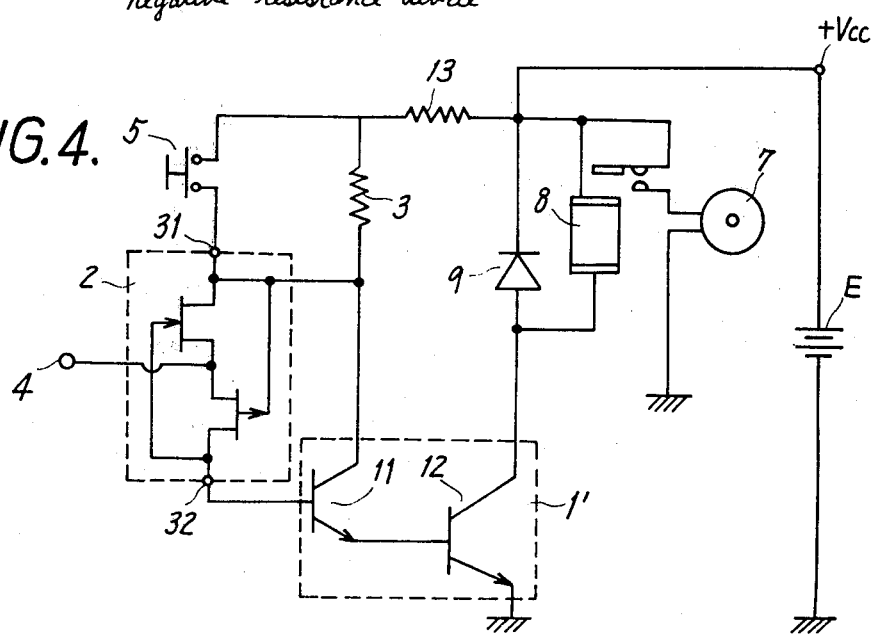
FIG. 4 is a circuit diagram of one example of a burglar alarm bell system employing the switch of FIG. 1.

FIG. 4 shows a burglar alarm system embodying the present invention, wherein, fundamental parts are similar to the example of FIG. 1 and are designated by the reference numerals and marks identical to those in FIG. 1. However, the transistor 1 of FIG. 1 is replaced by a Darlington connection 1' consisting of a first transistor 11 and a second transistor 12, the collector of which is connected through a coil of relay 8 for actuating an alarm bell 7 to the power source E. A known surge protection diode 9 for protecting the output transistor 12 from a surge current is connected across the coil of the relay 8.

Operation of the example of FIG. 4 is almost similar to that of FIG. 1.

When the touching electrode 4 is touched by a human body, the negative resistance device, as well as the Darlington-connection 1' of the transistors 11 and 12 turns on, and therefore, the relay 8 is energized. Accordingly, the bell circuit is closed and the bell is actuated to ring. The bell continues to ring until the circuit is reset by a temporary closing of the switch 5. Therefore, by connecting the touching electrode to a steel case of a safe, a touch by a burglar actuates the alarm bell to ring.

The type of the transistor, i.e., n-p-n or p-n-p type, should be selected responding to the polarity of the power source.

The transistor 1 or the composite circuit 1' of transistors may be replaced by any similar semiconductor switching device, such as a unijunction transistor, a thyristor and the like.

Since the negative resistance device 2, transistor(s) 1 or 1' are semiconductor devices and the resistors 3 and 13 can be made a semiconductor device too, the touch-operation switch of the present invention can be entirely semiconductorized, namely can be made as a compact monolithic semiconductor device.

The resetting switch 5 is connected so as to apply the source voltage to the collector of the transistor 1, in the first and the second examples, but a resetting switch can be situated in other places, for instance, in a manner to shortcircuit the base $b$ to emitter $e$ of the transistor 1, or to cut out the connection between the impedance element 3 to the collector $c$ of the transistor 1 as shown by dotted lines, or the like.

In a modified example, the resistor 3 may be an alarm bell, a light-emitting diode or a small lamp, of aforementioned appropriate resistance, in order to indicate the switching by sound or by light.

What is claimed is:

1. A touch-operation switch system for use with a D.C. power source comprising:
    a semiconductor swtiching device having an input terminal and at least one output terminal,
    a two terminal negative resistance device having first and second terminals respectively connected to said input and output terminals of said semiconductor switching device,
    the negative resistance device comprising complementary connection of a depletion mode n-channel junction-type field-effect transistor and a depletion mode p-channel junction-type field-effect transistor,
    each transistor having a gate and a pair of source-drain output circuit terminals with one of the output circuit terminals of the p-channel transistor being connected by a first connection to one of the output circuit terminals of the n-channel transistor and the gate of each transistor being connected by respective second and third connections to the other output circuit terminal of the other transistor,
    said second and third connections being respectively connected to said first and second terminals of said negative resistance device,
    a touching electrode connected to said first connection , and
    a circuit element having a specified resistance and being connected together with said switching device in series to each other for connection across said D.C. power source.

2. A touch-operation switch of claim 1 wherein said switching device is a bipolar transistor.

3. A touch-operation switch of claim 2 wherein said impedance element is a resistor.

4. A touch-operation switch of claim 1 wherein said circuit element is a resistor.

5. A touch-operation switch system for use with a D.C. power source comprising:
   a switching device having first and second terminals defining a main current path through which may flow a current to be controlled and having an input terminal for receiving a control signal for controlling said current,
   an impedance element having a specified impedance and connected serially with said main current path of the switching device for connection together across said D.C. power source,
   a two terminal negative resistance device having first and second terminals respectively connected to the junction between the impedance element and the switching device and to the input terminal of the switching device,
   the negative resistance device comprising complementary connection of a depletion mode n-channel junction-type field-effect transistor and a depletion mode p-channel junction-type field-effect transistor,
   each transistor having a gate and a pair of source-drain output circuit terminals with one of the output circuit terminals of the n-channel transistor being connected by a first connection to one of the output circuit terminals of the p-channel transistor and the gate of each transistor being connected by respective second and third connections to the other output circuit terminal of the other transistor,
   said second and third connections being respectively connected to said first and second terminals of said negative resistance device,
   a touching electrode connected to said first connection, and
   a resetting switch which switches to apply a voltage within the cut off range of the negative resistance device across both terminals of the negative resistance device.

6. A touch-operation switch of claim 5 wherein said switching device is a bipolar transistor and said input terminal is the base of said transistor.

7. A touch-operation switch of claim 6 wherein said resetting switch is connected across said impedance element.

8. A touch-operation switch of claim 7 wherein said impedance element is a resistor.

9. A touch-operation switch of claim 6 wherein said impedance element is a resistor.

10. A touch-operation switch of claim 5 wherein said resetting switch is connected across said impedance element.

11. A touch-operation switch of claim 10 wherein said impedance element is a resistor.

12. A touch-operation switch of claim 5 wherein said impedance element is a resistor.

13. In a solid state touch controlled switching system operable from a direct current power source and operable at a prescribed touch point by a person, the improvement in said switching system comprising:
   a semiconductor switching device having an input terminal and at least one output terminal,
   a two terminal negative resistance device having first and second terminals respectively connected to said input and output terminals and being capable of exhibiting a stable ON state with a positive resistance characteristic and a stable OFF state with a substantially infinite resistance characteristic with an unstable intervening state having a negative resistance characteristic,
   means including resistance connected to the junction of said output and second terminals for connecting said switching device and resistance in series and across said power source,
   a touch electrode connected to said negative resistance device in such a manner that when a person touches the touch electrode during operation of the system, the negative resistance device assumes said ON stable state, and
   reset switching means coupled to said switching system for changing said negative resistance device to its said OFF state.

14. A system as in claim 13 wherein said negative resistance device includes interconnected complementary field effect transistors each having an output circuit including source and drain terminals with said output circuits being serially connected between said first and second terminals of said negative resistance device, said touch electrode being connected to the series connection between said transistors.

15. A switching system as in claim 14 wherein one of said field effect transistors is a depletion mode n-channel junction type and the other is a depletion mode p-channel junction type each having a source, drain and gate with the sources being directly connected together and to said touch electrode and with each drain of each transistor being connected to the gate of the other transistor and to also respectively to said first and second terminals for the negative resistance device.

16. A switching system as in claim 13 wherein said resetting means includes a switch for momentarily shorting said resistance.

17. A system as in claim 13 wherein said resetting means includes a reset switch connected to said semiconductor switching device for turning said device off.

18. A switching system as in claim 17 wherein said semiconductor switching device has an emitter terminal, and said reset switch is a normally open switch connected between said input and emitter terminals of said semiconductor switching device.

19. A switching system as in claim 17 wherein said reset switch is a normally closed switch connected between said resistance and said output terminal of the semiconductor switching device.

20. A touch-operation switch of claim 13 wherein said resistance includes a resistor.

* * * * *